United States Patent [19]
Sato et al.

[11] 4,354,209
[45] Oct. 12, 1982

[54] RECORDING/PLAYING CIRCUIT

[75] Inventors: Tetsuo Sato, Fussa; Yasuo Kominami, Kokubunji, both of Japan

[73] Assignee: Hitachi, Ltd., Tokyo, Japan

[21] Appl. No.: 231,369

[22] Filed: Feb. 3, 1981

[30] Foreign Application Priority Data

Mar. 5, 1980 [JP] Japan .................................. 55-26547

[51] Int. Cl.³ .......................... G11B 15/12; G11B 5/02
[52] U.S. Cl. ......................................... 360/61; 360/67
[58] Field of Search ...................... 360/61, 67, 68, 137

[56] References Cited
FOREIGN PATENT DOCUMENTS 53-37005  4/1978  Japan ..................................... 360/61

Primary Examiner—Vincent P. Canney
Attorney, Agent, or Firm—Antonelli, Terry & Wands

[57] ABSTRACT

A recording/playing circuit includes a noise reduction circuit, a switching circuit and a control circuit. The noise reduction circuit includes a pre-amplifier, a combining network, an inverter circuit and a side chain. The switching circuit has first, second and third input positions and an output terminal. The first input position is coupled to the output of the pre-amplifier, the second input position is coupled to the output of the inverter circuit, and the output terminal is coupled to the side chain. The third input position is connected to a muting circuit. The control circuit controls the switching circuit so that one of the electric signals applied to the first, second and third input positions of the switching circuit may be selectively transmitted to the output terminal of the switching circuit.

7 Claims, 4 Drawing Figures

RECORDING/PLAYING CIRCUIT

DISCLOSURE UNDER 37 CFR 1.56(a)

The following information which we are aware of is disclosed under 37 CFR 1.56(a) as follows:
1. '79 SEMICONDUCTOR DATA BOOK, December 1979, pp. 144-157, published by Hitachi, Ltd.
2. R. Berkovitz and K. Gundry, "Dolby B-Type Noise Reduction System", The SERT Journal, Vol. 8, May/June 1974.
3. Ray M. Dolby "An Audio Noise Reduction System" Journal of the Audio Engineering Society, October 1967.
4. '80 SEMICONDUCTOR DATA BOOK INTEGRATED CIRCUITS FOR CONSUMER APPLICATIONS, March 1980, pp. 49-62, published by Hitachi, Ltd.

BACKGROUND OF THE INVENTION

This invention relates to improvements in a recording/playing circuit for use in a recording/playing apparatus for magnetic tapes, and more particularly, to a recording/playing circuit including a muting function which may be more easily fabricated using IC techniques.

In recording/playing apparatus, such as cassette tape decks and the like, it is desirable to provide a muting function to avoid the generation of switching shock noise during switching between the play and record operations, upon actuation of the stop switch or as a result of abnormal key entries. This is accomplished generally by some means which serves to isolate the output of the apparatus during the switching function; however, such isolation means may involve an additional switching function in the output circuit of the apparatus to switch in a muting amplifier or the like during normal switching operations.

Another important consideration in the design of such circuits is the ability to fabricate the circuits using IC technology. In this regard, the trend in the manufacture of all electronic products has been toward the total integration of circuits in order to reduce costs of manufacture and improve reliability and performance. Thus, in the design of a recording/playing circuit which includes a muting circuit, consideration must be given to a design which will facilitate IC manufacture thereof.

BRIEF SUMMARY OF THE INVENTION

It is therefore a general object of the present invention to provide an improved recording/playing circuit.

It is another object of the present invention to provide a circuit of the type described which includes a muting circuit.

It is a further object of the present invention to provide a circuit of the type described which may be fabricated in the form of an integrated circuit having a minimum number of external terminals.

In its most basic form, this invention provides a recording/playing circuit including an expansion/compression switching circuit which constitutes a noise reduction circuit formed of a switching circuit having three positions, one of which is provided for a muting function.

Further, according to a preferred embodiment of this invention, a control input of the switching circuit is provided with gate means so as to afford a preference to the muting operation. Thus, according to this invention, while achieving the simplification of the circuit arrangement and the reduction of the number of external terminals in the case where the circuit is fabricated in the form of a monolithic IC, shock noise during recording/playing switching can be reliably prevented from occurring.

These and other objects, features and advantages will be made more apparent from the following detailed description of various embodiments of the present invention taken in conjunction with the accompanying drawings.

DESCRIPTION OF THE PREFERRED EMBODIMENTS

Figure 1:
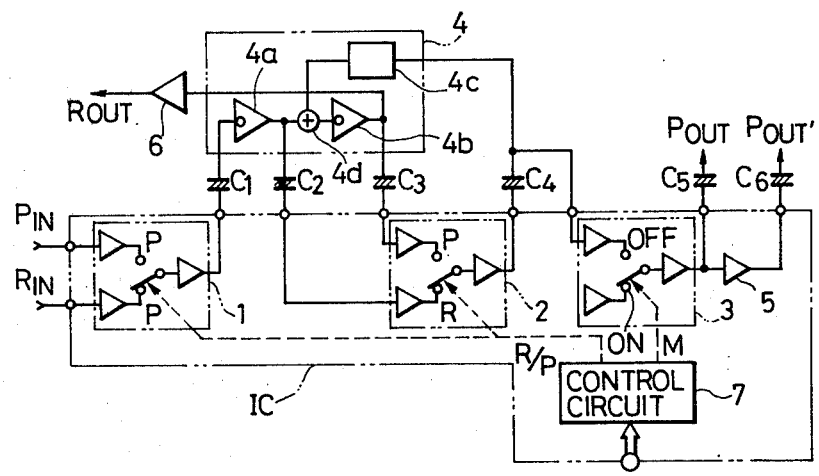
FIG. 1 is a schematic block diagram of a recording/playing circuit of the type to which this invention is applied.

In the circuit shown in FIG. 1, recording/playing signals $R_{IN}/P_{IN}$ are applied to a differential transistor switching circuit 1 which selects one of the other signal depending on the selected mode of operation of the circuit. The selected one of the signals $R_{IN}/P_{IN}$ are applied to a noise reduction circuit 4, constructed in the form of a compander for higher frequency signals, via coupling capacitor $C_1$.

More specifically, compander 4 is constructed of a preamplifier 4a, a combining network 4d which adds the output of the pre-amplifier 4a and the output of the side chain 4c for deriving only a high frequency signal, and an inverter circuit 4b which inverts the added output. The output of the inverter circuit 4b is applied to a recording amplifier 6 to provide a recording output $R_{OUT}$ to the record head (not shown). More specific details of such a switchable noise reduction system having a side chain or secondary path are described in "Dolby B-Type Noise Reduction System", the SERT Journal, Vol. 8, May/June 1974, pp. 99-103, by R. Berkovitz and K. Gundry.

A second switching circuit 2, similar to the first-mentioned switching circuit 1, receives the output of the pre-amplifier 4a in the noise reduction circuit 4 via coupling capacitor $C_2$ and the output of inverter 4b via coupling capacitor $C_3$. The selected output of the switching circuit 2 is applied via coupling capacitor $C_4$, on the one hand, to the side chain 4c in the noise reduction circuit 4 and, on the other hand, to a muting circuit 3 provided in the form of a switching circuit similar to the switching circuits 1 and 2. The output of switching circuit 3 is applied through coupling capacitor $C_5$ to the playing output $P_{OUT}$ and also through a headphone amplifier 5 to the playing output $P_{OUT}$. A control circuit 7 provides a recording/playing switching signal R/P and a mute signal M for controlling the switching circuits 1, 2 and 3.

The operation of the noise reduction circuit 4 is as follows:

During recording, the switching circuits 1 and 2 are set at the recording position R by the control circuit 7. Accordingly, a recording signal which is the output of the pre-amplifier 4a has added thereto an inphase higher frequency signal which is formed through the switching circuit 2 and the side chain 4c, and an output signal for recording with the higher frequency expanded is formed through the inverter circuit 4b.

In the case where a playing signal thus recorded is to be played, the switching circuit 2 is set at the playing position P by the control circuit 7. Accordingly, the expanded playing signal which is the output of the pre-amplifier 4a has added thereto an antiphase higher frequency signal (resulting in a subtraction) which is formed through the switching circuit 2 and the side chain 4c after the inversion by the inverter circuit 4b. At the output of the switching circuit 2, the playing signal with the high frequency compressed into the original level is obtained, and a high region noise is compressed.

During the switching operations performed by switching circuits 1 and 2 to switch between playing and recording, the control circuit 7 switches the muting circuit 3 to the ON terminal so that the playing outputs are connected to a muting amplifier, thereby isolating these outputs from any switching shock noise which might be generated.

As seen in FIG. 1, the recording/playing circuit may be fabricated to a large extent using IC techniques; however, due to the fact that this circuit includes three sets of switching circuits, when the circuit is fabricated in the form of a monolithic integrated circuit, a rather large number of external terminals are needed. This disadvantage can be eliminated by combining the switching circuits 2 and 3, as seen in FIG. 2.

Figure 2:
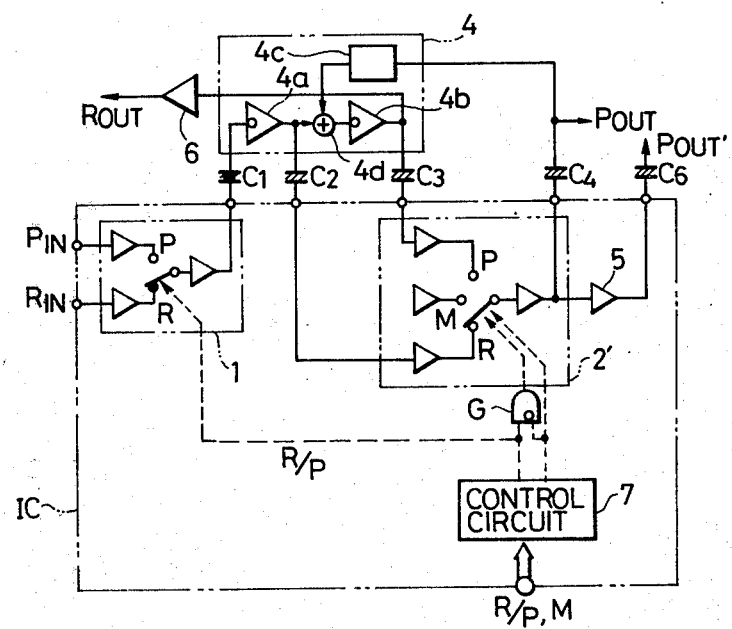
FIG. 2 is a schematic block diagram showing a preferred embodiment of this invention.

In the embodiment of FIG. 2, as the switching circuit 2', there is employed a three position switch which has a muting position M besides a playing input position P and a recording position R. It is thus possible with such a construction to achieve simplification of the circuit arrangement and reduction in the number of external terminals of the IC.

Further, in order to effectively prevent the occurrence of switching shock noise attributed to the switching of the switching circuit 1, a recording/playing switching signal R/P formed by the control circuit 7 is passed through a gate circuit G to form a recording/playing switching signal for the switching circuit 2', and a mute signal M is used as a gate control signal in this case so that when the mute signal M is provided, the recording/playing switching signal may be inhibited to afford a preference to the muting operation.

Even when, in this manner, the switching circuit constituting the noise reduction circuit 4 is endowed with the muting function in order to reduce the number of external terminals in the fabrication of the monolithic IC while achieving a simplification of the circuit arrangement, no inconvenience or reduction in efficiency is involved in the respective functions of the basic circuit.

Figure 3:
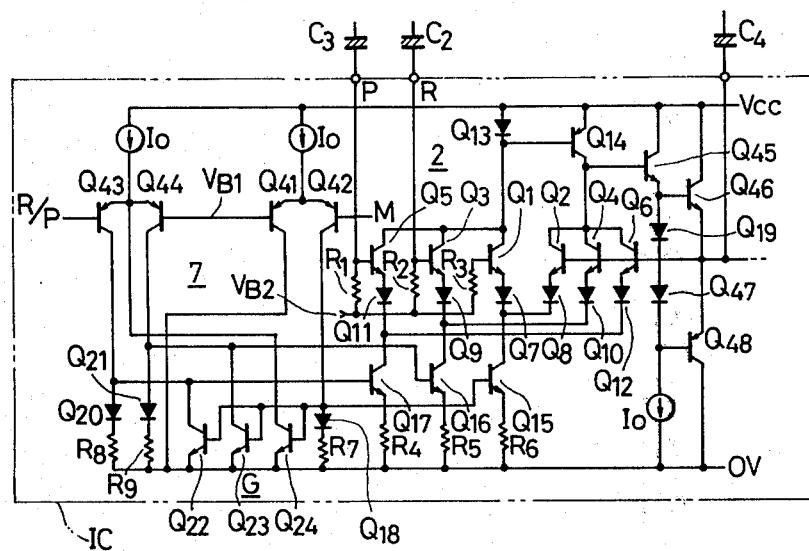
FIG. 3 is a schematic circuit diagram showing a specific circuit forming an embodiment of this invention.

FIG. 3 is a circuit diagram showing a specific example of an embodiment of the switching circuit 2' as well as the control circuit 7. According to the circuit of this embodiment, the output sides of voltage follower circuits constructed of a plurality of differential transistor circuits are made common, and a plurality of emitter constant-current sources of a plurality of differential transistors are selectively switched to operate only one set of differential transistors, whereby a switching operation is carried out.

More specifically, the outputs of differential circuits, which are respectively constructed of differential transistors $Q_1$ and $Q_2$ and an emitter constant-current source composed of a transistor $Q_{15}$ and a resistor $R_6$, differential transistors $Q_3$ and $Q_4$ and an emitter constant-current source composed of a transistor $Q_{16}$ and a resistor $Q_5$, and differential transistors $Q_5$ and $Q_6$ and an emitter constant-current source composed of a transistor $Q_{17}$ and a resistor $R_4$, are connected in common. The differential circuit is provided with a load circuit which is constructed of a current mirror circuit at $Q_{13}$ and $Q_{14}$.

The output of the current mirror circuit derived from the collector of transistor $Q_{14}$ is applied to an emitter follower circuit which is constructed of a transistor $Q_{45}$, level shift diodes (which shall include diode-connected transistors, the same being applied thereinbelow) $Q_{19}$ and $Q_{47}$, and a constant-current source $I_o$. The output of the emitter follower is used to drive a complementary push-pull output circuit at $Q_{46}$ and $Q_{48}$ so as to obtain an output. This output is negatively fed-back to the bases of the transistors $Q_2$, $Q_4$ and $Q_6$, which represent the inverting input terminals of the differential transistor circuits, and hence, voltage follower circuits are formed thereby.

The bases of the transistors $Q_1$, $Q_3$ and $Q_5$, which represent the non-inverting inputs of the differential transistor circuits, are supplied with a base bias voltage $V_{B2}$ through resistors $R_3$, $R_2$ and $R_1$, respectively. The base of the transistor $Q_1$ is supplied with only the bias voltage $V_{B2}$ in order to use it as a mute position input, whereas the bases of the transistors $Q_5$ and $Q_3$ are respectively provided with coupling capacitors $C_3$ and $C_2$ and are used as a playing position input P and a recording position input R.

Differential transistors $Q_{43}$ and $Q_{44}$ whose emitters are connected to a constant-current circuit $I_o$ apply the constant current $I_o$ selectively to diodes $Q_{20}$ and $Q_{21}$ on the basis of a recording/playing switching input R/P. The diodes $Q_{20}$ and $Q_{21}$ are respectively connected to resistors $R_8$ and $R_9$ to constitute current mirror circuits with the transistors $Q_{17}$ and $Q_{16}$. Upon switching the differential transistors $Q_{43}$ and $Q_{44}$, accordingly, one current mirror circuit operates to turn "on" the differential transistors $Q_3$ and $Q_4$, and the other operates to turn "on" the differential transistors $Q_5$ and $Q_6$, whereby switching selection of the recording and the playing functions can be effected.

Differential transistors $Q_{41}$ and $Q_{42}$ whose emitters are connected to a constant-current circuit $I_o$ generate a voltage across a diode $Q_{18}$ and a resistor $R_7$ in response to the "on" output of the transistors $Q_{42}$ which is turned "on" by the mute position input M. This voltage drives the transistor $Q_{15}$, resulting in operating the differential transistors $Q_1$ and $Q_2$ which constitute the mute position. The voltage across the diode $Q_{18}$ and the resistor $R_7$ also turns "on" transistors $Q_{22}$–$Q_{24}$, the forcibly turn "off" the respective current source circuits of the differential transistors $Q_3$ and $Q_4$ and differential transistors $Q_5$ and $Q_6$ of the recording and playing positions. Therewith, it forms a bias circuit of constant input current, to prefer the muting operation based on the muting position input signal M irrespective of the recording/playing switching signal R/P.

Diodes $Q_7$–$Q_{12}$ which are respectively disposed at the emitters of the differential transistors $Q_1$–$Q_6$ serve to prevent the counter flow of input signals of the transistors $Q_3$ and $Q_5$ in the "off" states to the other positions. They prevent the counter flow due to the reverse breakdown across the bases and emitters of the transistors, and hence, they are unnecessary when signal amplitudes are small.

This invention is not restricted to the foregoing embodiments, but in stereo tape recording/playing apparatus, the right and left channels are respectively provided with recording/playing switching circuits, noise reduction circuits, etc. Specific circuit arrangements of the switching circuit 2' constituting the noise reduction circuit and the gate circuit G can be variously modified. Further, the gate circuit G may well be included in the control circuit 7.

Figure 4:
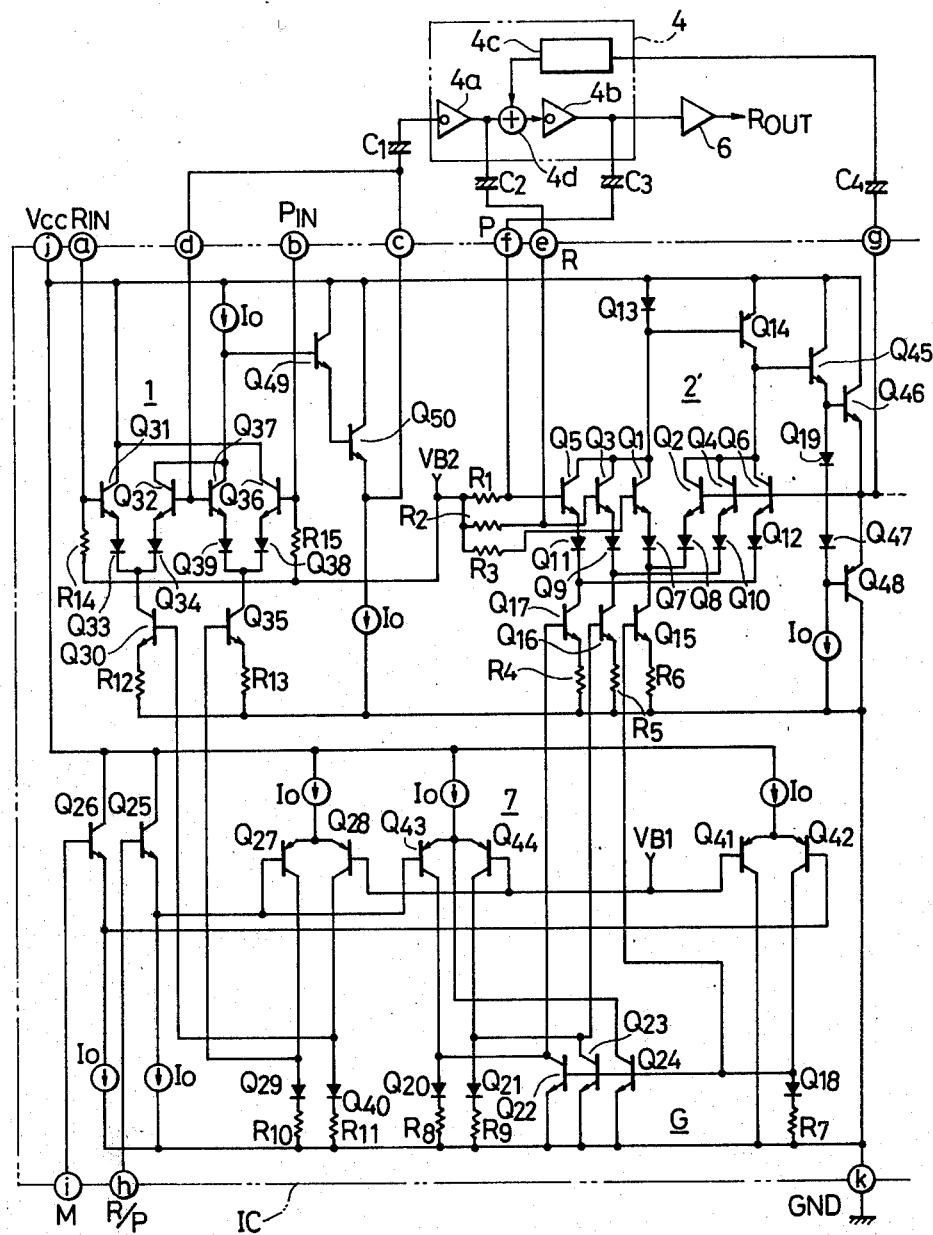
FIG. 4 is a schematic circuit diagram showing a specific circuit forming another embodiment of this invention.

FIG. 4 shows another exemplary embodiment of this invention. All circuit elements inside a broken line IC are constructed within a monolithic semiconductor integrated circuit. Symbols a-k enclosed with circles indicate external terminals of the monolithic semiconductor integrated circuit. Also, those elements which correspond to the elements of FIG. 3 bear the same reference numerals.

At recording, a control signal R/P which is applied to the external terminal h becomes high level, and a mute control signal M which is applied to the external terminal i becomes high level. Accordingly, transistors $Q_{27}$, $Q_{43}$ and $Q_{42}$ of a control circuit 7 turn "off", whereas the other transistors $Q_{28}$, $Q_{44}$ and $Q_{41}$ turn "on". Accordingly, a transistor $Q_{30}$ of a switching circuit 1 is controlled into the "on" state and a transistor $Q_{35}$ is controlled into the "off" state, and a transistor $Q_{16}$ of another switching transistor 2' is controlled into the "on" state and transistors $Q_{15}$ and $Q_{17}$ are controlled into the "off" state.

Then, a recording signal $R_{IN}$ applied to the external terminal a is transmitted to the external terminal c through transistors $Q_{31}$ and $Q_{32}$, diodes $Q_{33}$ and $Q_{34}$ and emitter follower transistors $Q_{49}$ and $Q_{50}$. The recording signal $R_{IN}$ transmitted to the external terminal c is applied to a noise reduction circuit 4 through a coupling capacitor $C_1$. Further, an output signal from a pre-amplifier 4a is applied to the external terminal e through a coupling capacitor $C_2$, and an output signal from an inverter circuit 4b is applied to the external terminal f through a coupling capacitor $C_3$.

During recording, however, the transistor $Q_{16}$ of the switching circuit 2' is in the "on" state and the transistors $Q_{17}$ and $Q_{15}$ are in the "off" state, and hence, only the output signal of the preamplifier 4a applied to the external terminal e is applied to a side chain 4c of the noise reduction circuit 4 through transistors $Q_3$ and $Q_4$, diodes $Q_9$ and $Q_{10}$, a current mirror circuit $Q_{13}$ and $Q_{14}$, an emitter follower transistors $Q_{45}$, a complementary push-pull output circuit $Q_{46}$ and $Q_{48}$, the external terminal g and a coupling capacitor $C_4$. Thus, a higher frequency signal formed through the switching circuit 2' and the side chain 4c is added to the recording signal of the pre-amplifier 4a, and a signal for recording with the higher frequency expanded can be provided from the output of the inverter circuit 4b.

During playing, the control signal R/P which is applied to the external terminal h becomes low level, and the mute control signal M which is applied to the external terminal i becomes high level. Accordingly, the transistors $Q_{28}$, $Q_{44}$ and $Q_{42}$ of the control circuit 7 turn "off", whereas the other transistors $Q_{27}$, $Q_{43}$ and $Q_{41}$ turn "on". Consequently, the transistor $Q_{35}$ of the switching circuit 1 is controlled into the "on" state and the transistor $Q_{30}$ is controlled into the "off" state; while, the transistor $Q_{17}$ of the other switching circuit 2' is controlled into the "on" state and the transistors $Q_{15}$ and $Q_{16}$ are controlled into the "off" state.

Then a playing signal $P_{IN}$ applied to the external terminal b is transmitted to the external terminal c through transistors $Q_{36}$ and $Q_{37}$, diodes $Q_{38}$ and $Q_{39}$ and emitter follower transistors $Q_{49}$ and $Q_{50}$. The playing signal $P_{IN}$ transmitted to the external terminal c is applied to the noise reduction circuit 4 through the coupling capacitor $C_1$. Further, the output signal of the pre-amplifier 4a is applied to the external terminal e through the coupling capacitor $C_2$, and the output signal of the inverter circuit 4b is applied to the external terminal f through the coupling capacitor $C_3$.

During playing, however, the transistor $Q_{17}$ of the switching circuit 2' is in the "on" state and the transistors $Q_{15}$ and $Q_{16}$ are in the "off" states, and hence, only the output signal of the inverter circuit 4b applied to the external terminal f is applied to the side chain 4c of the noise reduction circuit 4 through transistors $Q_5$ and $Q_6$, diodes $Q_{11}$ and $Q_{12}$, the current mirror circuit $Q_{13}$ and $Q_{14}$, the emitter follower transistor $Q_{45}$, the complementary push-pull output circuit $Q_{46}$ and $Q_{48}$, the output terminal g and the coupling capacitor $C_4$.

Thus, an antiphase higher frequency signal formed through the switching circuit 2' and the side chain 4c after the inversion by the inverter circuit 4b is added to the playing signal of the preamplifier 4a, and the playing signal with the higher frequency compressed into the original level can be obtained at the output of the switching circuit 2' (output terminal g).

During a muting operation, the mute control signal M which is applied to the external terminal i becomes low level, and hence, the transistors $Q_{41}$ of the control circuit 7 turns "off" and transistors $Q_{42}$, $Q_{22}$, $Q_{23}$ and $Q_{24}$ turn "on". Then, the transistor $Q_{15}$ of the switching circuit 2' changes to the "on" state and the transistors $Q_{16}$ and $Q_{17}$ change to the "off" state, so that the respective signal components applied to both the external terminals e and f are inhibited from being transmitted to the external terminal g.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A recording/playing circuit comprising:
   a noise reduction circuit which includes a pre-amplifier, a combining network, an inverter circuit and a side chain;
   a switching circuit which includes first, second and third input positions and an output terminal, said first input position being coupled to an output of said pre-amplifier of said noise reduction circuit, said second input position being coupled to an output of said inverter circuit of said noise reduction circuit, said output terminal being coupled to said side chain of said noise reduction circuit, and said third input position being connected to a muting circuit; and
   a control circuit for controlling said switching circuit to transmit to said output terminal of said switching circuit selectively one of the electric signals applied to the first, second and third input positions of said switching circuit.

2. A recording/playing circuit according to claim 1, further including means for applying a recording/playing switching control signal and a mute control signal selectively to said control circuit.

3. A recording/playing circuit according to claim 2, further comprising gate circuit means responsive to the application of said mute control signal to said control circuit for inhibiting said switching circuit from being set to said first or second input position by said recording/playing switching control signal.

4. A recording/playing circuit according to claim 1, further comprising another switching circuit which serves to transmit selectively one of a recording signal and a playing signal to said preamplifier of said noise reduction circuit.

5. A recording/playing circuit according to claim 1, said switching circuit comprising:
a first differential pair of transistors;
a second differential pair of transistors;
a third differential pair of transistors;
a first current source transistor which is coupled in common to the emitters of said first differential pair of transistors;
a second current source transistor which is coupled in common to the emitters of said second differential pair of transistors;
a third current source transistor which is coupled in common to the emitters of said third differential pair of transistors;
a load circuit which is coupled in common to said first, second and third differential pairs of transistors;
an emitter follower circuit which is arranged between said load circuit and said output terminal of said switching circuit; and
means for applying a bias voltage in common to the bases of said first, second and third differential pairs of transistors on one side thereof, said output terminal of said switching circuit being connected in a negative feedback manner to the bases of said first, second and third differential pairs of transistors on the other side thereof;
the base of said first differential pair of transistors on said one side being connected to said first input position, the base of said second differential pair of transistors on said one side being connected to said second input position, the base of said third differential pair of transistors on said one side being connected to said third input position, and said first, second and third current source transistors being connected to said control circuit so as to be selectively controlled into an operative state thereby.

6. A recording/playing circuit according to claim 5, further comprising another switching circuit which serves to selectively transmit one of a recording signal and a playing signal to said pre-amplifier of said noise reduction circuit.

7. A recording/playing circuit according to claim 6, said other switching circuit comprising:
a fourth differential pair of transistors;
a fifth differential pair of transistors;
a fourth current source transistor which is coupled in common to the emitters of said fourth differential pair of transistors;
a fifth current source transistor which is coupled in common to the emitters of said fifth differential pair of transistors;
another load circuit which is coupled in common to said fourth and fifth differential pairs of transistors;
another emitter follower circuit which is arranged between said other load circuit and said pre-amplifier of said noise reduction circuit; and
means for applying the recording signal to a base of one of said fourth differential pair of transistors and means for applying the playing signal to the base of one of said fifth differential pair of transistors, one of said fourth and fifth current source transistors being selectively controlled into an operative state by said control circuit.

* * * * *